United States Patent [19]

Igarashi

[11] Patent Number: 4,550,290

[45] Date of Patent: Oct. 29, 1985

[54] FET POWER AMPLIFYING APPARATUS

[75] Inventor: Hiroshi Igarashi, Tokyo, Japan

[73] Assignee: Fujitsu Limited, Kawasaki, Japan

[21] Appl. No.: 632,052

[22] Filed: Jul. 18, 1984

[30] Foreign Application Priority Data

Jul. 22, 1983 [JP] Japan .............................. 58-133721

[51] Int. Cl.$^4$ ........................... H03F 1/26; H03F 3/10
[52] U.S. Cl. ...................................... 330/149; 330/277
[58] Field of Search ................ 330/149, 151, 277, 294

[56] References Cited

U.S. PATENT DOCUMENTS 3,980,967 9/1976 Seidel .................................. 330/149

Primary Examiner—James B. Mullins
Assistant Examiner—G. Wan
Attorney, Agent, or Firm—Staas & Halsey

[57] ABSTRACT

An FET linear power amplifying apparatus with an FET power amplifier and a distortion generator which produces a distortion signal indicative of a distortion component having the same amplitude and inverted phase as those of a distortion component produced by the FET power amplifier. The amplitude and the phase of the distortion signal are controlled in accordance with a control signal which depends upon the magnitude ratio of the input and output signals of the apparatus. The distortion component which will be produced by the FET power amplifier is compensated by the controlled distortion signal.

17 Claims, 4 Drawing Figures

FET POWER AMPLIFYING APPARATUS

BACKGROUND OF THE INVENTION

1. Field of the Invention

The present invention relates to a field effect transistor (FET) power amplifying apparatus, particularly to an FET linear power amplifying apparatus for single side band (SSB) multiplex communication systems.

2. Description of the Prior Art

In conventional linear power amplifying apparatuses for SSB multiplex communication systems traveling-wave tubes (TWT) are used for linear power amplification and such an apparatus contains various problems. For example, the characteristics of the TWT change as the TWT ages, the TWT manufacturing costs are high and the TWT has a high power consumption.

Recently, the power amplifying performance of FETs has been up-graded, and FETs are now widely used for linear power amplification. However, FET linear power amplifying apparatuses contain problems in that distortion characteristics and gain characteristics change in proportion to changes in ambient temperature.

SUMMARY OF THE INVENTION

Therefore, it is an object of the present invention to provide an FET power amplifying apparatus which can suppress or reduce the amount of distortion changes to an extremely low level.

According to the present invention, the above object is achieved by an FET power amplifying apparatus comprising: an FET power amplifier which amplifies an input signal to produce an output signal; means for producing a control signal which corresponds to a magnitude ratio of the input signal and the output signal; means for receiving an input signal and for producing a distortion signal indicative of a distortion component having the same amplitude and inverted phase as that of a distortion component produced by the FET power amplifier when the input signal is applied thereto; means for controlling the amplitude and phase of the produced distortion signal in accordance with the produced control signal; and means for compensating the distortion component being produced by the FET power amplifier, in accordance with the controlled distortion signal.

DESCRIPTION OF THE PREFERRED EMBODIMENTS

Figure 1:
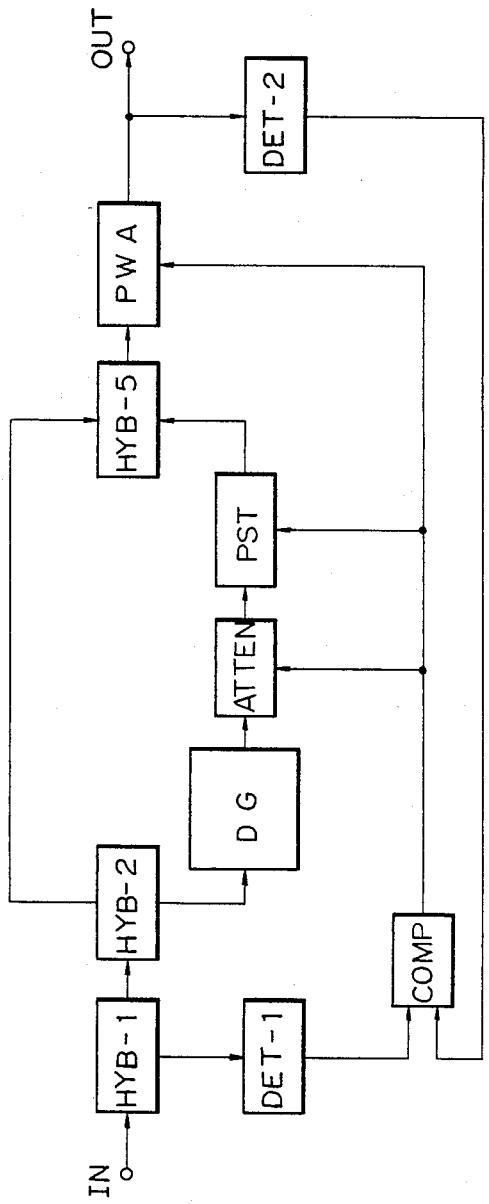
FIG. 1 is a block diagram of an embodiment according to the present invention.

FIG. 1 is a schematic illustration of an FET linear power amplifying device for an SSB multiplex communication system as an embodiment of the present invention. In FIG. 1, HYB-1, HYB-2, and HYB-5 denote hybrid circuits, DET-1 and DET-2 detectors, COMP a differential amplifier circuit, DG a distortion generator, ATTEN a variable attenuator circuit, PST a variable phase shifter circuit, and PWA an FET power amplifier circuit.

An input signal applied to an input terminal IN of this device is divided into two input signals by the hybrid circuit HYB-1. One of the divided input signals is detected by the detector DET-1 to produce the DC voltage component of the input signal. This produced DC voltage component is applied to one input terminal of the differential amplifier circuit COMP. The other divided input signal is applied to the hybrid circuit HYB-2 and further divided into two signals; one of which is applied to the hybrid circuit HYB-5, and the other to the distortion generator DG.

The distortion generator DG produces a distortion signal having a distortion component equivalent to a distortion component which will be produced by the FET power amplifier circuit PWA.

The distortion signal is applied to the hybrid circuit HYB-5 via the variable attenuator circuit ATTEN and the variable phase shifter circuit PST. Therefore, the amplitude and phase of the distortion signal can be changed by the attenuator circuit ATTEN and phase shifter circuit PST irrespective of the input signal.

The hybrid circuit HYB-5 superimposed the distortion signal onto the divided input signal applied from the hybrid circuit HYB-2, and this superimposed signal is applied to the FET power amplifier circuit PWA. If the distortion signal applied to the hybrid circuit HYB-2 is adjusted by the attenuator circuit ATTEN and the phase shifter circuit PST so that the amplitude of the distortion signal is the same as the amplitude of a distortion component produced by the FET power amplifier circuit PWA and the phase of the distortion signal is inverse to or 180° out of phase with the phase of a distortion component produced by the FET power amplifier circuit PWA, the distortion component of the FET power amplifier circuit PWA can be cancelled. Therefore, the amount of distortion included in the output signal from the FET power amplifier circuit PWA can be considerably reduced.

The output signal from the FET power amplifier circuit PWA is output via an output terminal OUT and also applied to the detector DET-2. The detector DET-2 detects the output signal and produces the DC voltage component of the input signal. The produced DC voltage is applied to the other input terminal of the differential amplifier circuit COMP.

The FET power amplifier circuit PWA is controlled to maintain the gain of the FET power amplifying device at a constant in accordance with the input/output signal levels detected by the detectors DET-1 and DET-2. That is the linearity of the input/output level characteristics is maintained. It is important to maintain linearity in the input/output characteristics of the FET power amplifying device for amplifying a signal having an amplitude component such as a SSB signal.

Figure 2:
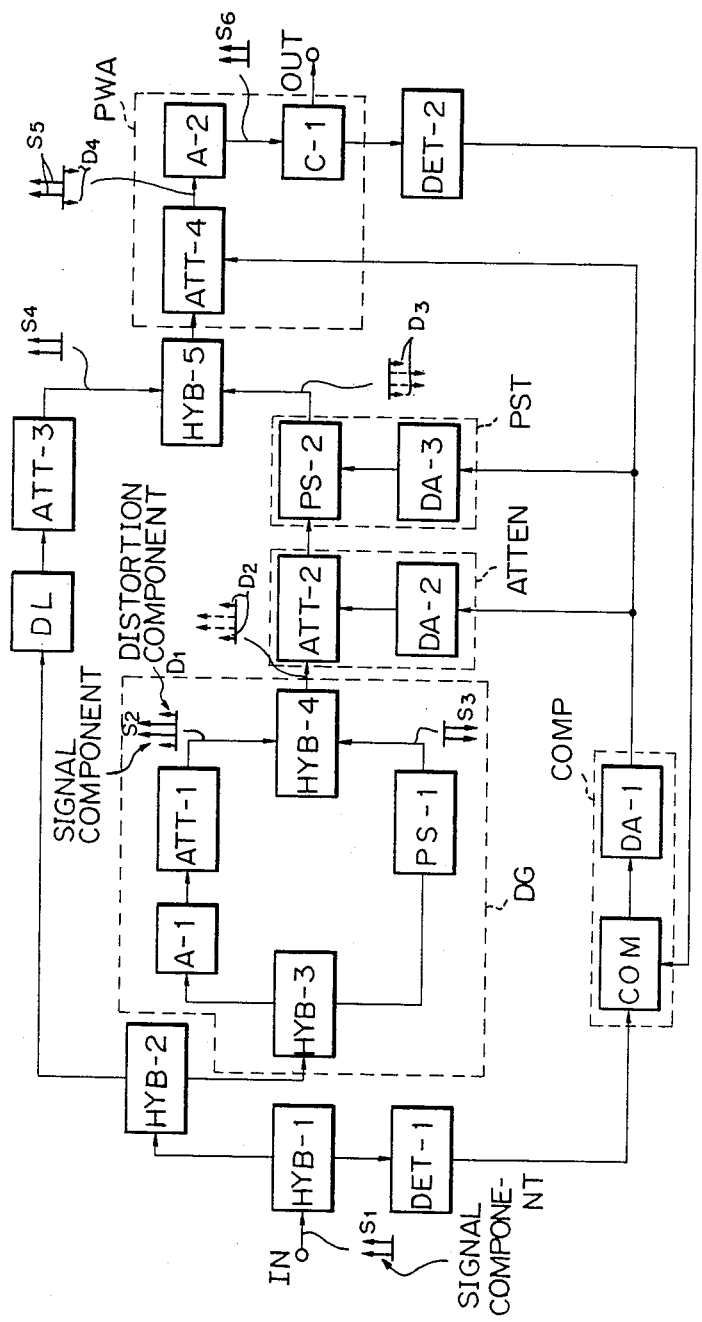
FIG. 2 is a block diagram showing more details of the embodiment of FIG. 1.

When the gain of the FET power amplifier circuit PWA changes based upon the change in the surrounding environment, for example, changes in the ambient temperature, the DC voltages detected by the detectors DET-1 and DET-2 differ from each other and, thus, the output of the differential amplifier circuit COMP also changes, causing an adjustment in the attenuation factor of the attenuator circuit ATTEN and phase shifting amount of the phase shifter circuit PST. Accordingly, a change in the amount of distortion of the FET power amplifier circuit PWA, accompanied by a change in the gain thereof can be automatically compensated. FIG. 2 shows the details of the embodiment of FIG. 1.

As shown in FIG. 2, the distortion generator DG is composed of hybrid circuits HYB-3 and HYB-4, an FET amplifier A-1, a fixed attenuator ATT-1, and a fixed phase shifter PS-1. A divided input signal from the hybrid circuit HYB-2 is applied to the hybrid circuit HYB-3, and further divided into two signals. One signal is applied to the FET amplifier A-1 to produce a distortion similar to the distortion which will be produced by the FET power amplifier circuit PWA. The other signal is applied to the phase shifter PS-1 to invert the phase, i.e., to shift the phase by 180°. The output from the FET amplifier A-1 is applied to the hybrid circuit HYB-4 via the attenuator ATT-1. Output from the phase shifter PS-1 is also applied to the hybrid circuit HYB-4 to be superimposed on the output from the FET amplifier A-1. If the attenuation factor of the attenuator ATT-1 and the phase shifter PS-1 are determined so that the amplitudes of signal components of the outputs applied to the hybrid circuit HYB-4 coincide, the hybrid circuit HYB-4 can produce a distortion signal which includes only the distortion component produced by the FET amplifier A-1.

In FIG. 2, the arrows $S_1$ to $S_6$ indicate the signal component of the input signal. The input signal includes only the signal component. The arrows $D_1$ to $D_4$ indicate the distortion component produced by FET amplifiers. Since the hybrid circuit HYB-4 receives the inverted signal component $S_3$ from the phase shifter PS-1 and the signal component $S_2$ plus distortion component $D_1$ from the attenuator ATT-1, which are superimposed upon each other, the output (distortion signal) from the hybrid circuit HYB-4 becomes only the distortion component $D_2$, shown in FIG. 2.

The attenuator circuit ATTEN is composed of a variable attenuator ATT-2 and a DC amplifier DA-2, and the phase shifter circuit PST is composed of a variable phase shifter PS-2 and a DC amplifier DA-3.

The amplitude and phase of the distortion signal are adjusted by the attenuator ATT-2 and the phase shifter PS-2, and thus the adjusted and inverted distortion signal $D_3$ is applied to the hybrid circuit HYB-5. The input signal having only signal component $S_4$ is applied to this hybrid circuit HYB-5 via a delay circuit DL and a fixed attenuator ATT-3, which adjusts the timing and amplitude of the input signal to be superimposed. Therefore, the output from the hybrid circuit HYB-5 includes, as shown in FIG. 2, the noninverted signal component $S_5$ and the inverted distortion component $D_4$.

The FET power amplifier circuit PWA is composed of a variable attenuator ATT-4, a FET power amplifier A-2, and a directional coupler C-1, and the differential amplifier circuit COMP is composed of a differential amplifier COM and a DC amplifier DA-1. The attenuator ATT-4 connected between the hybrid circuit HYB-5 and the FET power amplifier A-2 controls the amplitude of the signal applied to the FET power amplifier A-2, in accordance with a control signal fed from the differential amplifier COM via the DC amplifier DA-1. That is, this attenuator ATT-4 carries out automatic gain control for controlling a gain of the amplifying device at a constant so as to maintain the linearity of the device.

As mentioned above, since the signal applied to the FET power amplifier A-2 has the inverted distortion component, the distortion component produced by this FET power amplifier A-2 itself can be cancelled. Thus the output signal from the FET power amplifier A-2 includes only the signal component $S_6$ shown in FIG. 2.

The output signal from the FET power amplifier A-2 is output via the directional coupler C-1. A part of the output signal is applied to the detector DET-2 from the directional coupler C-1. The detector DET-2 detects the DC voltage component of the output signal and feeds the detected voltage component to the differential amplifier COM which controls the attenuation factor of the attenuator ATT-4 and etc. During this condition, the output signal level follows the change in the input signal level.

When the gain of the FET power amplifier A-2 changes because of, for example, temperature changes, the ratio of the DC voltages from the detectors DET-1 and DET-2 varies, causing the control signal output from the differential amplifier COM to change. As a result, the attenuation factor of the attenuator ATT-4 changes in accordance with the change in the control signal and, thus, the gain of the FET power amplifying device can be stabilized.

The control signal is further applied to the attenuator ATT-2 via a DC amplifier DA-2, and to the phase shifter PS-2 via a DC amplifier DA-3, to control the attenuator factor and phase shifting amount thereof. Thus, the change in the amount of distortion in the FET power amplifier A-2 which occurs in accordance with the change in gain of the FET power amplifier A-2 itself can be compensated.

As mentioned hereinbefore, the present invention utilizes the phenomenon wherein the change in the characteristics of the distortion component produced in an FET linear power amplifier is similar to the change in the characteristics of the distortion compensating component obtained from a distortion generator using an FET. That is, a control signal for automatic gain control of the FET linear power amplifying device is used to control the amplitude and phase of a distortion signal used to cancel the distortion component from the FET power amplifier. Therefore, an FET linear power amplifying device for an SSB multiplex communicaton system having little distortion can be obtained.

Figure 3:
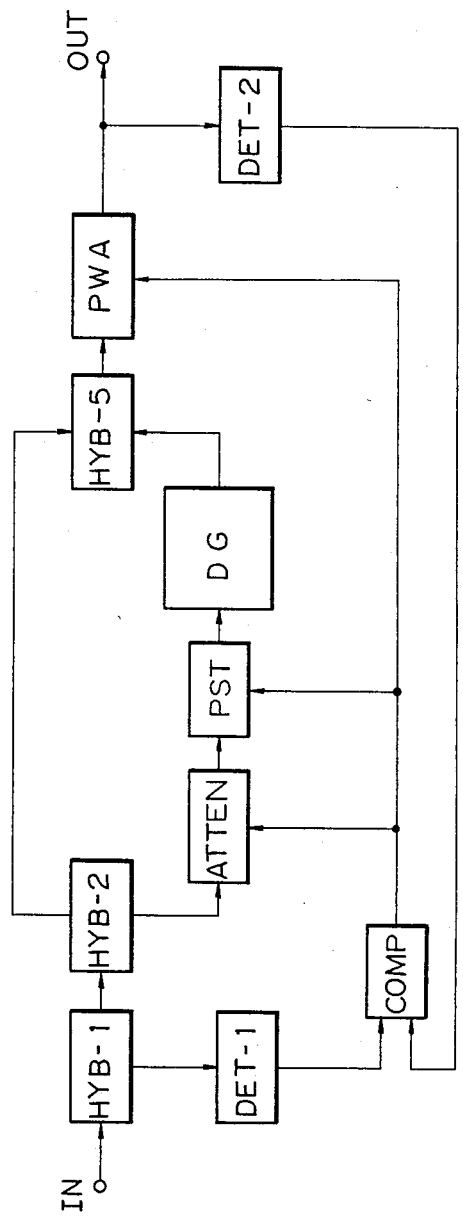
FIG. 3 is a block diagram of another embodiment according to the present invention.
Figure 4:
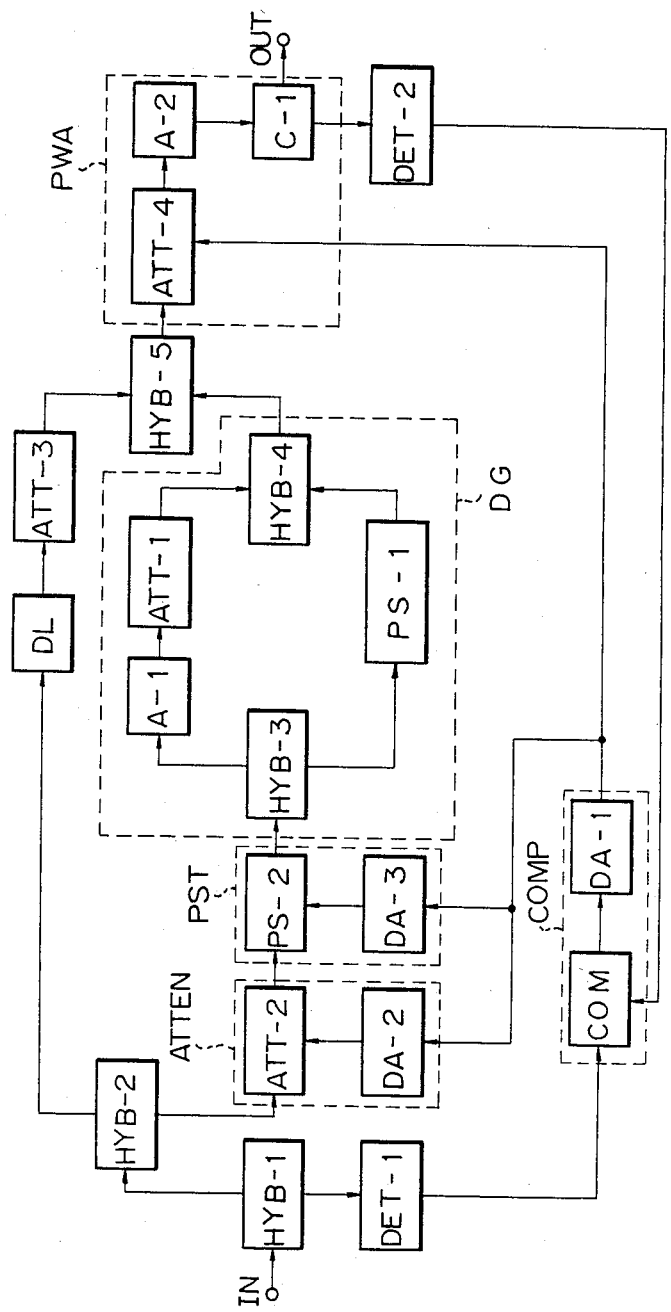
FIG. 4 is a block diagram showing more details of the embodiment of FIG. 3.

FIG. 3 schematically illustrates an FET linear power amplifying device for an SSB multiplex communication system as another embodiment of the present invention, and FIG. 4 illustrates the details of the embodiment of FIG. 3.

In this embodiment, the variable attenuator circuit ATTEN and the variable phase shifter circuit PST are connected and located ahead of the distortion generator DG. The divided input signal from the hybrid circuit HYB-2 is first applied to the attenuator circuit ATTEN and the phase shifter circuit PST, wherein the amplitude and phase are controlled, and the controlled signal is then applied to the distortion generator DG. The structure, operation, and effect of this embodiment are the same as those of the embodiment of FIGS. 1 and 2.

Many widely different embodiments of the present invention may be constructed without departing from the spirit and scope of the present invention. It should be understood that the present invention is not limited to the specific embodiments described in this specification, except as defined in the appended claims.

I claim:

1. An FET power amplifying apparatus, comprising:
   an FET power amplifier for amplifying an input signal to produce an output signal;

means for producing a control signal which corresponds to a magnitude ratio of the input signal and the output signal;

means for receiving the input signal and for producing a distortion signal having a distortion component with the same amplitude and an inverted phase as a distortion component produced by said FET power amplifier when the input signal is applied thereto;

means for controlling the amplitude and phase of said produced distortion signal in accordance with said produced control signal; and means for compensating the distortion component being produced by said FET power amplifier, in accordance with said controlled distortion signal.

2. An apparatus as claimed in claim 1, wherein said means for producing the control signal includes:
first wave detecting means for producing a first voltage signal indicative of the magnitude of the input signal; and
second wave detecting means for producing a second voltage signal indicative of the magnitude of the output signal.

3. An apparatus as claimed in claim 2, wherein said means for producing the control signal further includes means for comparing said first and second voltage signals and for producing the control signal which corresponds to a voltage ratio of said first and second voltage signals.

4. An apparatus as claimed in claim 1, wherein said means for producing the distortion signal includes:
an FET amplifier, having substantially the same construction as said FET power amplifier, for receiving an input signal and for producing a signal having a signal component the same as the input signal and a distortion component;
means for phase inverting the input signal; and
means for superimposing the produced signal from said FET amplifier onto the inverted phase input signal to produce a distortion signal.

5. An apparatus as claimed in claim 1, wherein said means for controlling includes:
means for variably attenuating said produced distortion signal in accordance with said produced control signal; and
means for variably phase shifting said produced distortion signal in accordance with said produced control signal.

6. An apparatus as claimed in claim 1, wherein said means for compensating includes means for superimposing said controlled distortion signal onto an input signal to produce a signal having an inverted phase as the phase of a distortion component which will be produced by said FET power amplifier, said produced signal being applied to said FET power amplifier.

7. An FET power amplifying apparatus, comprising:
an FET power amplifier for amplifying an input signal to produce an output signal;
means for producing a control signal which corresponds to a magnitude ratio of the input signal and the output signal;
means for receiving the input signal and for producing a distortion signal having a distortion component with the same amplitude and an inverted phase as a distortion component produced by said FET power amplifier when the input signal is applied thereto;

means for controlling the amplitude and phase of said produced distortion signal in accordance with said produced control signal;

means for superimposing said controlled distortion signal onto the input signal to produce a signal having an inverted phase distortion component as compared to the phase of the distortion component which will be produced by said FET power amplifier; and means for variably attenuating said superimposed signal in accordance with said produced control signal.

8. An apparatus as claimed in claim 7, wherein said means for producing the control signal includes:
first wave detecting means for producing a first voltage signal indicative of the magnitude of the input signal; and
second wave detecting means for producing a second voltage signal indicative of the magnitude of the output signal.

9. An apparatus as claimed in claim 8, wherein said means for producing the control signal further includes means for comparing said first and second voltage signals and for producing the control signal which corresponds to a voltage ratio of said first and second voltage signals.

10. An apparatus as claimed in claim 7, wherein said means for producing the distortion signal includes:
an FET amplifier, having substantially the same construction as said FET power amplifier, for receiving the input signal and for producing a signal having a signal component the same as the input signal and a distortion component;
means for phase inverting the input signal; and
means for superimposing the produced signal from said FET amplifier onto the inverted phase input signal to produce a distortion signal.

11. An apparatus as claimed in claim 7, wherein said means for controlling includes:
means for variably attenuating said produced distortion signal in accordance with said produced control signal; and
means for variably phase shifting said produced distortion signal in accordance with said produced control signal.

12. An FET power amplifying apparatus, comprising:
an FET power amplifier for amplifying an input signal to produce an output signal;
means for producing a control signal which corresponds to a magnitude ratio of the input signal and the output signal;
means for controlling at least the amplitude of the input signal in accordance with said produced control signal;
means for receiving the controlled input signal and for producing a distortion signal with a distortion component with the same amplitude and an inverted phase as a distortion component produced by said FET power amplifier when the controlled signal is applied thereto; and
means for compensating the distortion component being produced by said FET power amplifier, in accordance with said controlled distortion signal.

13. An apparatus as claimed in claim 12, wherein said means for producing the control signal includes:

first wave detecting means for producing a first voltage signal indicative of the magnitude of the input signal; and second wave detecting means for producing a second voltage signal indicative of the magnitude of the output signal.

14. An apparatus as claimed in claim 13, wherein said means for producing the control signal further includes means for comparing said first and second voltage signals and for producing the control signal which corresponds to a voltage ratio of said first and second voltage signals.

15. An apparatus as claimed in claim 12, wherein said means for producing the distortion signal includes:

an FET amplifier, having substantially the same construction as said FET power amplifier, for receiving the controlled input signal and for producing a signal having a signal component the same as the input signal and a distortion component;

means for phase inverting the controlled input signal; and means for superimposing the produced signal from said FET amplifier onto the inverted phase controlled input signal to produce a distortion signal.

16. An apparatus as claimed in claim 12, wherein said means for controlling includes:

means for variably attenuating the input signal in accordance with said produced control signal; and means for variably phase shifting the input signal in accordance with said produced control signal.

17. An apparatus as claimed in claim 12, wherein said means for compensating includes means for superimposing said distortion signal onto the input signal to produce a signal having an inverted phase as compared to the phase of the distortion component produced by said FET power amplifier, said produced signal being applied to said FET power amplifier.

* * * * *

UNITED STATES PATENT AND TRADEMARK OFFICE
CERTIFICATE OF CORRECTION

PATENT NO. : 4,550,290

DATED : October 29, 1985

INVENTOR(S) : HIROSHI IGARASHI

It is certified that error appears in the above-identified patent and that said Letters Patent is hereby corrected as shown below:

[57] ABSTRACT, "those of" should be deleted.

Signed and Sealed this

Eighteenth Day of March 1986

[SEAL]

Attest:

DONALD J. QUIGG

Attesting Officer

Commissioner of Patents and Trademarks